(12) United States Patent
Kim et al.

(10) Patent No.: US 8,576,368 B2
(45) Date of Patent: Nov. 5, 2013

(54) DRIVING CIRCUIT FOR A LIQUID CRYSTAL DISPLAY DEVICE, METHOD OF MANUFACTURING THE SAME AND DISPLAY DEVICE HAVING THE SAME

(75) Inventors: Yun-Hee Kim, Hwaseong-si (KR); Ho-Min Kang, Suwon-si (KR); Jong-Sig Hyun, Suwon-si (KR)

(73) Assignee: Samsung Display Co., Ltd. (KR)

( * ) Notice: Subject to any disclaimer, the term of this patent is extended or adjusted under 35 U.S.C. 154(b) by 1056 days.

(21) Appl. No.: 11/986,594

(22) Filed: Nov. 21, 2007

(65) Prior Publication Data
US 2008/0180376 A1    Jul. 31, 2008

(30) Foreign Application Priority Data
Nov. 22, 2006 (KR) .................. 10-2006-0115743

(51) Int. Cl.
    *G02F 1/1345* (2006.01)
(52) U.S. Cl.
    USPC ............. 349/152; 349/149; 345/104; 345/92; 438/613; 257/E21.002; 257/772
(58) Field of Classification Search
    USPC .................. 438/119; 257/737; 349/152, 149
    See application file for complete search history.

(56) References Cited

U.S. PATENT DOCUMENTS

| 4,606,962 A * | 8/1986 | Reylek et al. ................. 428/148 |
| 5,034,245 A * | 7/1991 | Matsubara ..................... 430/314 |
| 5,332,869 A | 7/1994 | Hagiwara |
| 6,937,314 B2 * | 8/2005 | Kim ............................... 349/149 |
| 7,109,058 B2 * | 9/2006 | Yamada et al. ............... 438/106 |
| 2003/0027379 A1 | 2/2003 | Liu |
| 2004/0065949 A1 | 4/2004 | Chen et al. |
| 2004/0134974 A1 | 7/2004 | Oh et al. |
| 2004/0224441 A1 * | 11/2004 | Saito ............................. 438/119 |
| 2005/0041189 A1 * | 2/2005 | Hong et al. .................... 349/149 |
| 2005/0184389 A1 * | 8/2005 | Chen et al. ..................... 257/737 |
| 2006/0038298 A1 * | 2/2006 | Park et al. ..................... 257/772 |
| 2006/0055037 A1 * | 3/2006 | Park et al. ..................... 257/737 |

(Continued)

FOREIGN PATENT DOCUMENTS

| CN | 1532905 | 9/2004 |
| EP | 1018761 | 7/2000 |

(Continued)

OTHER PUBLICATIONS

European Search Report, Application No. EP 07022442, Jun. 2, 2009, 10 pp.

*Primary Examiner* — Edward Glick
*Assistant Examiner* — Sang V Nguyen
(74) *Attorney, Agent, or Firm* — Innovation Counsel LLP

(57) ABSTRACT

A driving circuit for a liquid crystal display, the driving circuit being an integrated circuit having electrode pads disposed on a surface of the integrated circuit, bumps formed on the electrode pads, a conductive adhesive layer formed on the bumps and conductive particles having an outer conductive layer and an elastic polymer inner portion deposited on the conductive adhesive layer. The driving circuit is mounted on a TFT array substrate and bonded to pads provided on the substrate. The conductive particles reduce electrical connection resistance that would otherwise arise due to height differences between bumps in a plurality of bumps, and prevents electrical open defects and an electrical short defects.

17 Claims, 9 Drawing Sheets
(1 of 9 Drawing Sheet(s) Filed in Color)

(56) References Cited

U.S. PATENT DOCUMENTS

| | | | |
|---|---|---|---|
| 2006/0211232 A1* | 9/2006 | Liu et al. | 438/613 |
| 2007/0080453 A1* | 4/2007 | Jang et al. | 257/737 |
| 2007/0252274 A1* | 11/2007 | Daubenspeck et al. | 257/737 |
| 2007/0267745 A1* | 11/2007 | Chao et al. | 257/737 |
| 2007/0298603 A1* | 12/2007 | Rebibis et al. | 438/613 |
| 2009/0283903 A1* | 11/2009 | Park | 257/737 |

FOREIGN PATENT DOCUMENTS

| | | |
|---|---|---|
| JP | 06-331999 | 12/1994 |
| JP | 2003-309255 | 10/2003 |
| JP | 2005-108992 | 4/2005 |
| JP | 2005-229044 A | 8/2005 |
| JP | 2005-302870 A | 10/2005 |
| WO | WO2008095405 | 8/2008 |

* cited by examiner

DRIVING CIRCUIT FOR A LIQUID CRYSTAL DISPLAY DEVICE, METHOD OF MANUFACTURING THE SAME AND DISPLAY DEVICE HAVING THE SAME

CROSS-REFERENCE TO RELATED APPLICATIONS

The present application claims the benefit of priority under 35 U.S.C. §119 of Korean Patent Application No. 10-2006-115743, filed on Nov. 22, 2006 in the Korean Intellectual Property Office (KIPO), the contents of which are herein incorporated by reference in their entirety.

BACKGROUND OF THE INVENTION

1. Field of the Invention

The present invention relates to a driving circuit for a liquid crystal display (LCD) device. More particularly, the present invention relates to a driving circuit for an LCD device, a method of manufacturing the driving circuit and a display device having the driving circuit.

2. Description of the Related Art

A liquid crystal display (LCD) device has advantageous characteristics such as reduced thickness, light weight, low power consumption, and has good resolution, color reproducibility, and display quality. Thus, the LCD device, which is a type of flat panel display device, is being widely used and intensively researched.

The LCD device typically includes an LCD panel having a thin-film transistor (TFT) array substrate, a color filter substrate, a liquid crystal layer located between the TFT array substrate and the color filter substrate, a backlight assembly disposed under the LCD panel to serve as a light source, and a driving circuit part disposed at a peripheral portion of the LCD panel to drive the LCD panel. The LCD panel includes two glass substrates (the TFT array substrate and the color filter substrate mentioned above), a plurality of pixels disposed between the two glass substrates and arranged in a matrix shape on the thin-film transistor (TFT) array substrate and for each pixel a switching element such as a TFT for controlling signals provided to the pixel.

The driving circuit part includes a printed circuit board (PCB) on which parts for generating various signals such as a control signal, a clock signal, and a data signal, are mounted. A driving circuit that is an LCD driver integrated circuit (IC) (LDI) is connected to the LCD panel and the PCB to apply a signal to wirings formed on the LCD panel. The LCD driver integrated circuit includes a set of bonding pads with each bonding pad including a metal bump. The surface to which the driver integrated circuit is to be mounted is provided with a matching set of pads. The driver integrated circuit is mounted on the surface by bonding the set of bonding pads to the matching set of pads.

Examples of LDI mounting methods include chip-on-glass (COG), tape carrier package (TCP), and chip-on-film (COF). The LDI mounting methods require fine pad pitch bonding, an easy bonding process and high reliability, especially with the increasing complexity of an LDI chip arising from, for example increases in the number of pixels and high resolution. Thus, a method of forming a bump and a method of fine pad pitch bonding are key technologies.

When a conventional driving circuit is mounted on an LCD panel by using an anisotropic conductive film (ACF), the driving circuit and the LCD panel are electrically connected to each other through the conventional ACF. The AFC comprises electrically conductive particles dispersed in a non-conductive film. In the connection through the conventional ACF, the ACF is adhered to the glass TFT array substrate and the driver IC is bonded to the ACF. Thereafter, in a final bonding process, a plurality of conductive particles flows in the ACF and some of the conductive particles are captured between the bumps and the pads on the TFT array substrate, thereby electrically connecting the driving circuit to the pads and to wiring on the TFT array substrate. However, only about 10 to 30 percent of an original amount of the conductive particles are captured in the manner described, and thus much of the conductive particles are wasted. In addition, as the area of the bumps is made smaller, the number of conductive particles trapped between the bumps and the pads becomes smaller and thereby increases the resistance of the electrical connections between the bumps and the pads.

The pitch of a COG chip becomes finer as an LCD device becomes smaller, lighter and thinner, and the pitch of an outer lead bonding (OLB) or a film-on-glass (FOG) bonding also becomes finer.

When an interval between bumps of a COG chip is less than or equal to about 15 μm, an agglomeration of the conductive particles may extend from one bump to an adjacent bump, thus forming an electrical connection between the bumps to cause an electrical short defect. As noted above, as the area of the bumps decreases the number of conductive particles trapped between a pad and a bump decreases. Indeed, the number of captured conductive particles may be zero, the lack of the conductive particles causing an electrical open defect after the COG bonding.

The above-mentioned defects may be found during manufacture of an LCD or they may be found by end users of a LCD device after some time has elapsed. Thus, yield and reliability may be degraded.

SUMMARY OF THE INVENTION

The present invention provides a driving circuit for a liquid crystal display (LCD) device capable of easily being electrically connected to the LCD device through bonding pads in which conductive particles are disposed on a bump.

The present invention further provides a method of manufacturing the driving circuit.

The present invention still further provides an LCD device having the driving circuit.

In one aspect of the present invention, a driving circuit includes a resin layer formed on a bump on an integrated circuit (IC) pad electrode, and a conductive particle deposited on and coupled to the resin layer. The resin layer is electrically conductive and the conductive particle adheres to the resin layer.

The conductive particle may have, for example, a spherical shape, a hexahedron shape, a tetrahedron shape or any suitable shape. The conductive particle includes an outer portion comprising an electrically conductive material and an inner portion comprising an elastic material such as an elastic polymer. The elastic material may be compressed during bonding so as to prevent an electrical connection defect due to height differences between individual bumps in a plurality of bumps.

In a first exemplary embodiment, a driving circuit for an LCD device includes an integrated circuit IC, an electrode pad, a bump and a conductive particle. The IC generates a signal. The electrode pad is formed on the IC to externally transmit the signal. The bump is formed on the electrode pad to receive the signal. The conductive particle is disposed on the bump to electrically connect the bump to an external electronic device.

The driving circuit may further include a resin layer between the bump and the conductive particle. The resin layer is electrically conductive.

The conductive particle may include an outer layer including an electrically conductive material and an inner portion including an elastic polymer material.

The electrically conductive material may include at least one of the metals gold (Au) and nickel (Ni).

In another embodiment of the invention, a method of manufacturing a driving circuit for an LCD device is provided as follows. An electrode pad is formed on an integrated circuit chip portion of a wafer. A first passivation layer is formed on the chip. An opening is provided in the passivation layer to expose a portion of the pad. A second passivation layer is formed on the first passivation layer. An opening in the second passivation layer is provided to again expose the portion of the pad. A metal layer is formed on the second passivation layer and on the exposed portion of the pad. A photoresist pattern having an opening corresponding to the pad is formed. The opening is filled with metal to form a bump. A resin layer having electrical conductivity is formed on the bump and the photoresist pattern. Conductive particles are sprayed onto the resin layer. The photoresist pattern is removed such that the conductive particles remain only on the bump.

The conductive particles may be sprayed onto the resin layer by using an ink jet or a fine nozzle.

Each of the conductive particles may include an outer layer including an electrical conductive material and an inner portion including an elastic polymer material.

In another exemplary embodiment, an LCD device includes a driving circuit, a thin-film transistor (TFT) array substrate, a color filter substrate and a liquid crystal layer. The driving circuit includes an IC, an electrode pad, a bump and a conductive particle. The IC generates a signal. The electrode pad is formed on the IC to externally transmit the signal. The bump is formed on the electrode pad to receive the signal. The conductive particle is disposed on the bump. The TFT array substrate includes a pad electrically connected to the bump of the driving circuit through the conductive particle of the driving circuit. The color filter substrate faces the TFT array substrate. The liquid crystal layer is disposed between the TFT array substrate and the color filter substrate.

The driving circuit may include a plurality of bumps electrically insulated from each other.

The LCD device may further include a non-conductive adhesive configured to adhere the bump of the driving circuit to the TFT array substrate.

The non-conductive adhesive may include one of a non-conductive film, a non-conductive paste, an ultraviolet adhesive and an epoxy group adhesive.

The conductive particle may include an outer layer including an electrically conductive material and an inner portion including an elastic polymer material.

The electrically conductive material may include at least one metal selected from the group consisting of gold and nickel.

BRIEF DESCRIPTION OF THE DRAWINGS

The patent or application file contains at least one drawing executed in color. Copies of this patent or patent application publication with color drawings will be provided by the U.S. Patent and Trademark Office upon request and payment of the necessary fee.

The above and other features and advantages of the present invention will become more apparent based on the following detailed description of exemplary embodiments thereof, taken with reference to the accompanying drawings, in which:

FIG. 10 also shows in cross-section a driving circuit in accordance with an exemplary embodiment of the present invention;

DESCRIPTION OF THE EMBODIMENTS

Figure 1:
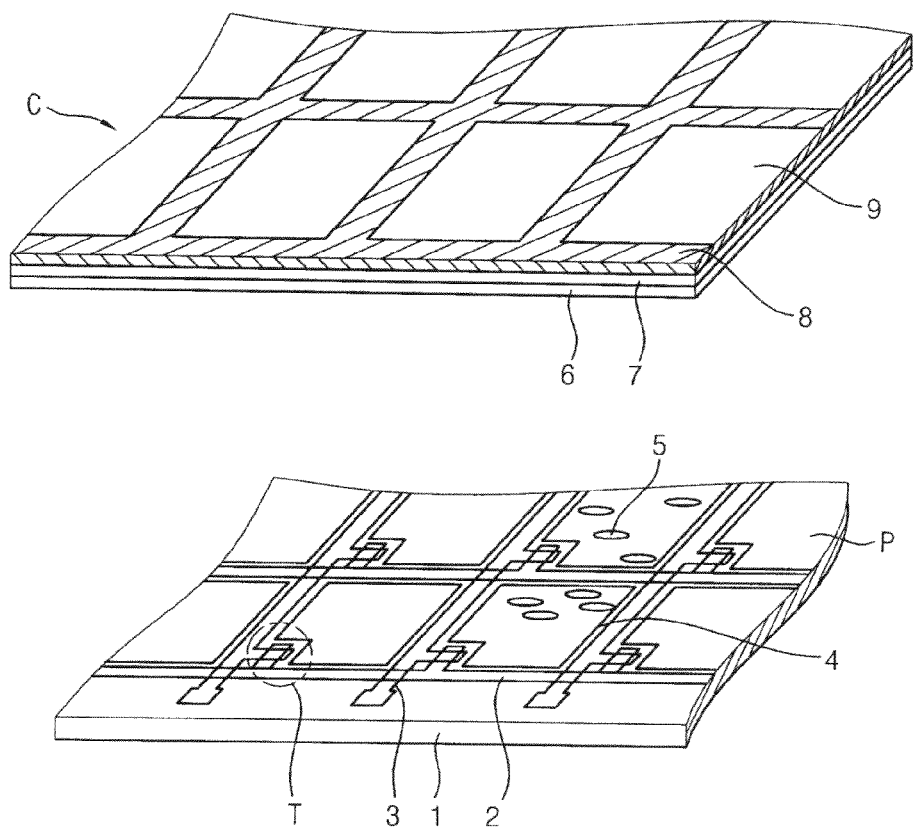
FIG. 1 is an exploded perspective view illustrating a liquid crystal display (LCD) panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is an exploded perspective view illustrating a liquid crystal display (LCD) panel according to an exemplary embodiment of the present invention.

As shown in FIG. 1, an LCD device includes a color filter substrate 7, a thin-film transistor (TFT) array substrate 1 and a liquid crystal layer 5 interposed between the color filter substrate 7 and the TFT array substrate 1.

The color filter substrate 7 includes a color filter layer having red, green and blue color filters 9, a black matrix 8 dividing the color filters and blocking light passing through the liquid crystal layer 5, and a transparent common electrode 6 for applying a voltage to the liquid crystal layer 5.

Gate lines and data lines are horizontally and vertically formed on the TFT array substrate 1. Pixel areas are defined between the intersections of gate and data lines on the TFT array substrate 1. A TFT switching element is formed in each pixel area. The TFT switching elements are located adjacent to intersections between the gate lines 2 and the data lines 3. A pixel electrode is also formed in each pixel area. Each TFT switching element controls the application of a data voltage to its associated pixel electrode.

Each pixel area corresponds to one of the color filters 9 of the color filter substrate 7. A full color image may be obtained by combining red, green and blue colors. On the color filter substrate, the color filters 9 are arranged in groups of three including red, green and blue to produce full color images.

Figure 2:
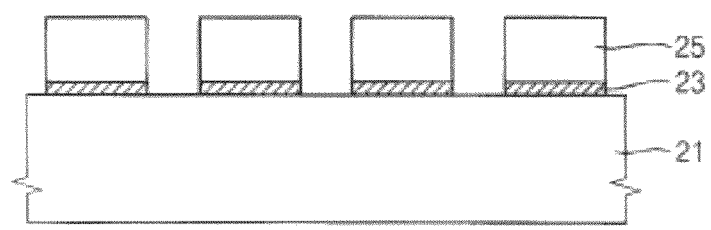
FIG. 2 is a cross-sectional view illustrating a conventional driving circuit for an LCD device.

FIG. 2 is a cross-sectional view illustrating a conventional driving circuit that is used in an LCD device.

Electrodes 23 are formed on the driving circuit 21. A bump 25 is formed on each of the electrodes 23. The bumps are to be directly electrically connected to pads provided on a TFT array substrate in an LCD device.

Figure 3:
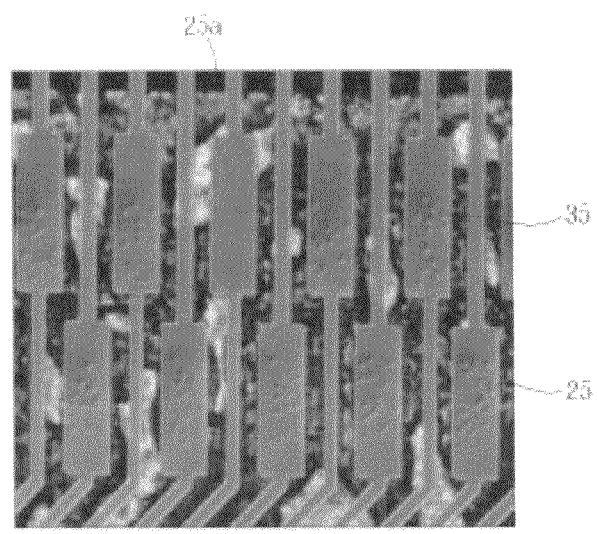
FIG. 3 is a photomicrograph illustrating an electrical open defect that is generated at a bump when the conventional driving circuit is mounted on an LCD panel.

FIG. 3 is a photomicrograph showing an electrical open circuit defect that occurred at a bump when a conventional driving circuit was mounted on an LCD device.

Figure 4:
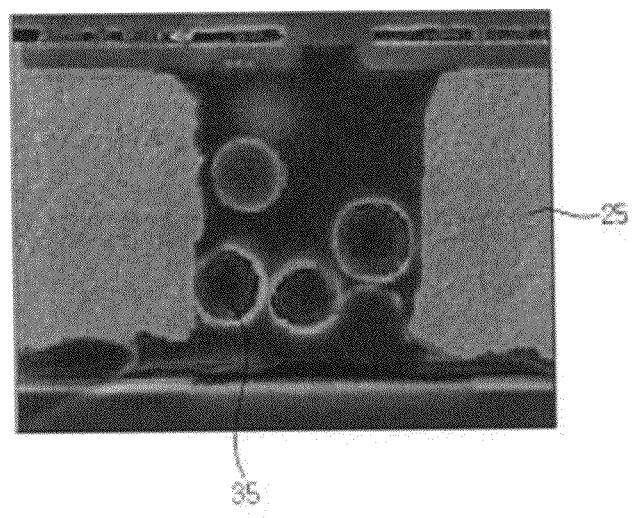
FIG. 4 is a photomicrograph illustrating an electrical short defect that is generated at a bump when the conventional driving circuit is mounted on the LCD panel.

FIG. 4 is a photomicrograph showing a cross-sectional view of an electrical short circuit defect that occurred between two bumps when a conventional driving circuit was mounted on an LCD device.

Referring to FIGS. 3 and 4, two types of defects are apparent. When an interval between bumps 25 on a COG chip is less than or equal to about 15 μm, an agglomeration of the conductive particles 35 may form an electrical connection between adjacent bumps 25 to cause an electrical short circuit defect (refer to FIG. 4). As shown in FIG. 3, conductive particles 35 are present on all the bumps 25 but are absent from bump 25a. The reduction of the areas of the bumps 25 leads to a lack of the conductive particles 35 and an electrical open circuit defect after the COG bonding.

Hereinafter, a method of manufacturing a driving circuit for an LCD having a conductive particles disposed on bumps will be described with reference to FIGS. 5 through 10.

FIGS. 5 to 10 are cross-sectional views illustrating a method of manufacturing a driving circuit according to an exemplary embodiment of the present invention. For convenience, FIGS. 5-10 show cross sections of the driving circuit that is part of a wafer (not shown) containing many such driving circuits, the wafer being later divided into individual driving circuits like the one shown in FIGS. 5-10.

Figure 5:
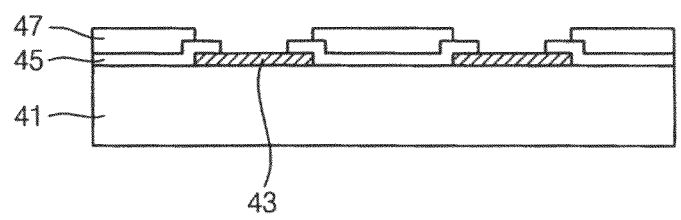
FIGS. 5 to 10 are cross-sectional views illustrating a method of manufacturing a driving circuit according to an exemplary embodiment of the present invention.

Referring to FIG. 5, a chip 41 contains circuits (not shown) that are required to provide the functions of a driving circuit. Hereinafter the chip 41 may be referred to as an integrated circuit 41. Electrode pads 43 are formed on the chip 41. These electrode pads 43 provide electrical connections to chip 41, with some of electrode pads dedicated to receiving signals, other electrode pads dedicated to outputting signals and others providing power and ground connections. A passivation layer 45 is formed on chip 41 and on the electrode pads 43. Openings are provided in the passivation layer 45 to expose a portion of each electrode pad 43. A layer of electrically insulating material such as a polyimide layer 47 is formed on the passivation layer 45. Openings are provided in the polyimide layer 47 so that the open portion of each electrode pad 43 is again exposed. The layer 47 may hereinafter be referred to as a second insulating layer 47.

Figure 6:
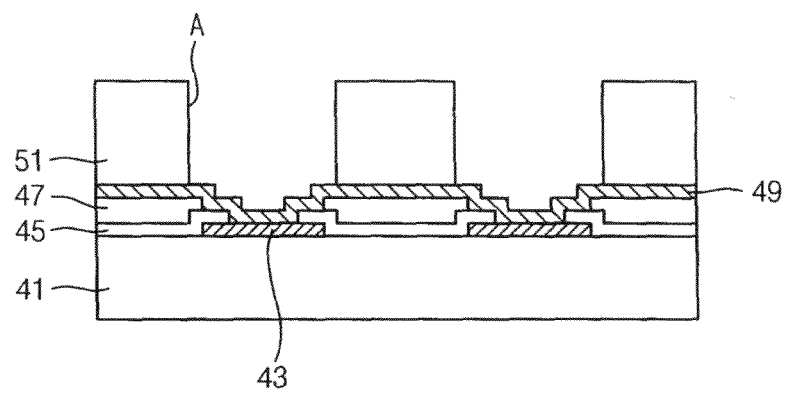

Referring to FIG. 6, an under bump metallurgy (UBM) layer 49 is formed on the chip 41 having the passivation layer 45 and the polyimide layer 47. The under bump metallurgy layer 49 is optional. Thereafter, a photoresist pattern 51 is formed on the UBM layer 49. The photoresist pattern 51 has openings A corresponding to the electrode pads 43. The photoresist pattern 51 may be obtained by using a positive type photoresist material. Alternatively, the photoresist pattern 51 may be obtained by using a negative type photoresist material.

Figure 7:
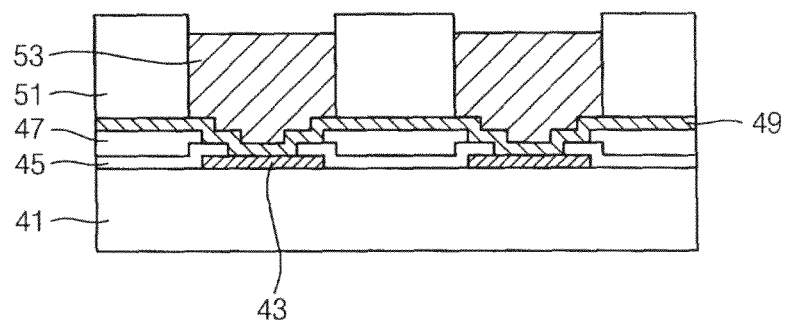

Referring to FIG. 7, an electroplating operation is performed so that the openings in the photoresist pattern 51 are filled with metal, to thereby form bumps 53. Examples of metals suitable for forming the bumps 53 include gold (Au) and nickel (Ni) and may include other suitable metals. These metals may be used alone or in a combination thereof.

Figure 8:
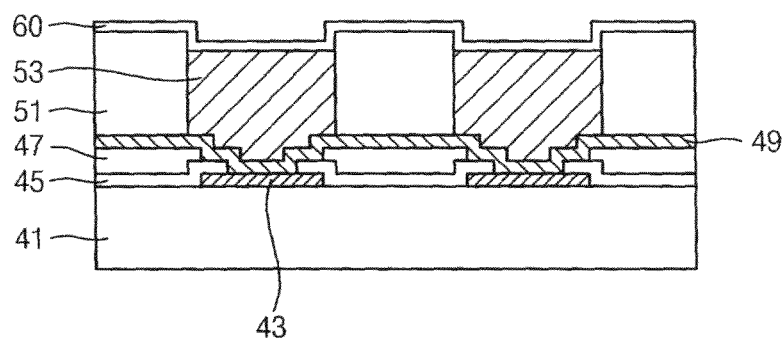

Referring to FIG. 8, after the bumps 53 are formed, instead of immediately stripping the photoresist pattern 51, an adhesive material is coated on the photoresist pattern 51 and on the bumps 53 to form an adhesive layer 60. The adhesive material may comprise a resin material and the adhesive layer 60 may hereinafter be referred to as a resin layer 60. The adhesive material includes an electrically conductive material so that conductive particles 30 deposited on the bumps 53 are in good electrical contact with the electrode pads 43. Examples of the electrically conductive material used in the adhesive layer 60 may include silver paste.

Figure 9:
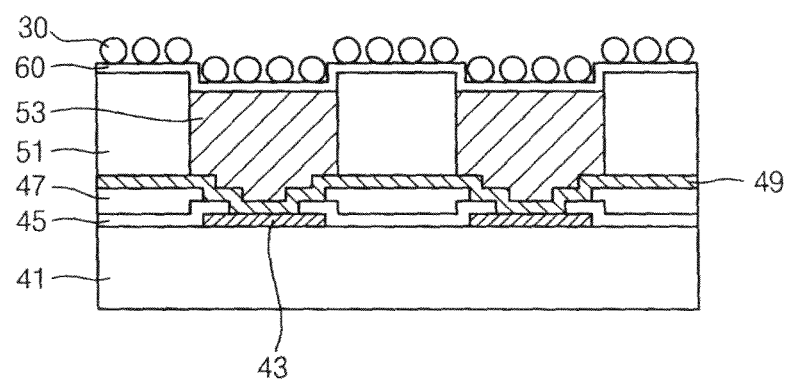

Referring to FIG. 9, electrically conductive particles 30 are uniformly sprayed onto the adhesive layer 60. Each of the conductive particles 30 includes an outer portion including at least one layer of metal, and an inner portion comprising an elastic material such as an elastic polymer. The outer portion may include a single metal layer, or may include a first metal layer and a second metal layer that are different in composition from each other. Examples of the metal forming the outer portion may include gold (Au), nickel (Ni), or copper (Cu). These metals may be used alone or in a combination thereof.

An ink jet or fine nozzle or other suitable device may be used to uniformly apply the conductive particles 30 to the adhesive layer 60, thereby increasing uniformity of the distribution of the conductive particles 30.

After the conductive particles 30 are adhered to the adhesive layer 60, the photoresist pattern 51 is removed, and the UBM layer 49 (if present) is etched so that the UBM layer 49 remains only under the bump 53.

Figure 10:
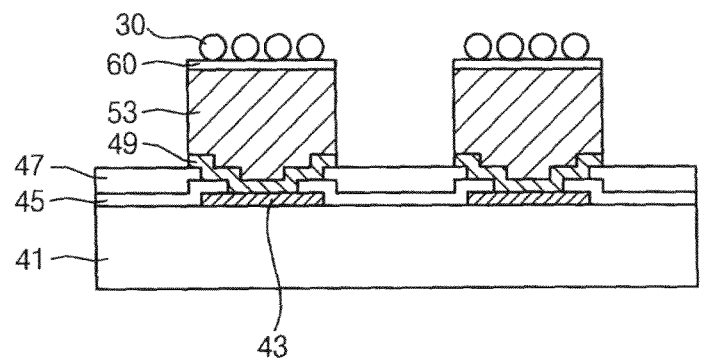

Referring to FIG. 10, through the above-described processes, a driving circuit for an LCD device having conductive particles 30 that are attached to the bumps 53 is finally completed. The driving circuit 40 comprises an integrated circuit 41, electrode pads 43 formed on the integrated circuit 41, bumps 53 formed on the electrode pads 43, a conductive adhesive layer 60 formed on the bumps 53 and conductive particles 30 deposited on the adhesive layer 60.

Figure 11A:
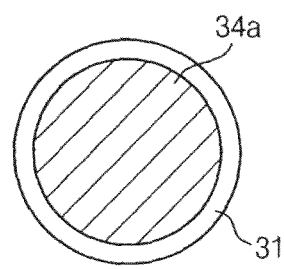
FIGS. 11A and 11B are cross-sectional views illustrating conductive particles used in a driving circuit according to an exemplary embodiment of the present invention.
Figure 11B:
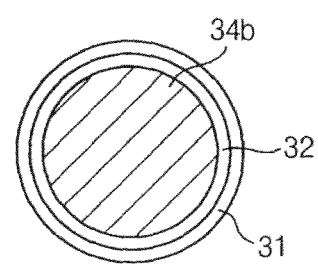

FIGS. 11A and 11B are cross-sectional views illustrating a conductive particle as used in a driving circuit according to an exemplary embodiment of the present invention. FIGS. 11A and 11B illustrate shapes and structures of the conductive particles 30.

Referring to FIGS. 11A and 11B, the conductive particles 30 uniformly electrically connect the bump 53 and an LCD panel to each other to reduce electrical connection resistance. In FIG. 11A, a conductive particle 30a includes an outer portion comprising a layer 31 including an electrically conductive material such as a metal. The conductive particle 30a also includes an inner portion 34a including an elastic material such as an elastic polymer. In FIG. 11B, a conductive particle 30b includes an outer portion including a first metal layer 31 and a second metal layer 32 that are different from each other in their composition, and an inner portion 34b comprising an elastic material such as an elastic polymer. Examples of the metal forming the outer portion may include gold (Au), nickel (Ni), and copper (Cu). These may be used alone or in a combination thereof. Alternatively, other metal materials having excellent electrical conductivity may be employed in the metal layers.

Figure 12:
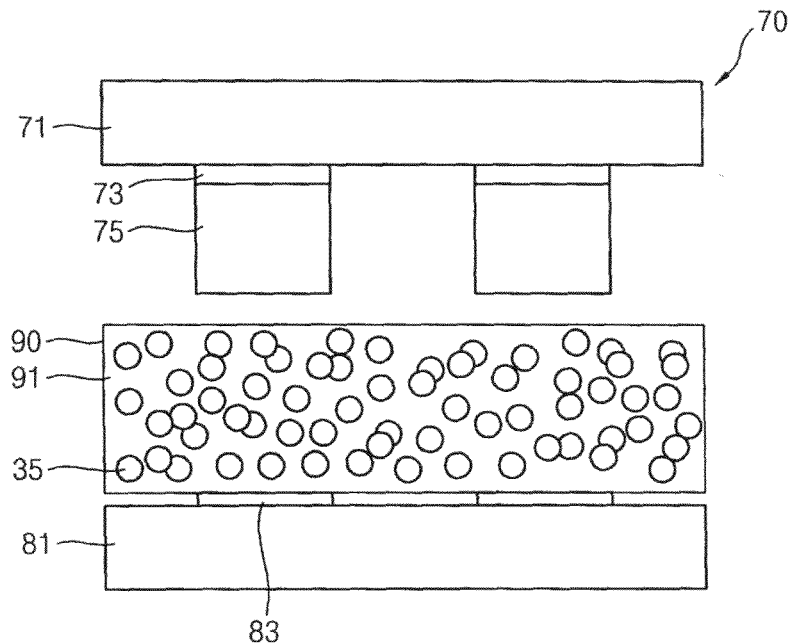
FIG. 12 is a cross-sectional view illustrating a method of mounting a conventional driving circuit on an LCD device by using an anisotropic conductive film (ACF)
Figure 13:
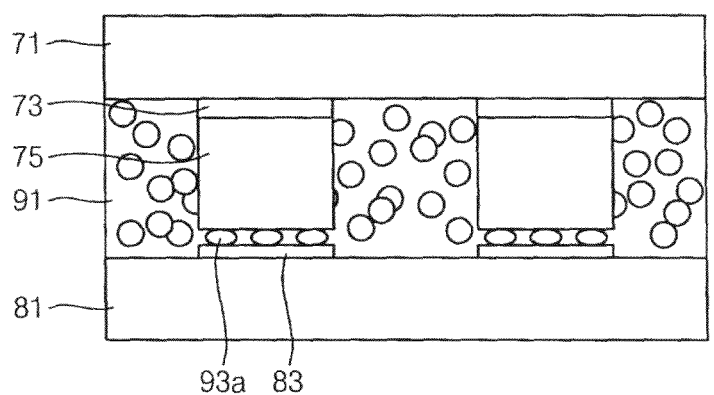
FIG. 13 is a cross-sectional view illustrating a structure of the conventional driving circuit on an LCD device by using the ACF.

FIG. 12 is a cross-sectional view illustrating a method of mounting a conventional driving circuit on an LCD device by using an anisotropic conductive film (ACF). FIG. 13 is a cross-sectional view illustrating a structure of the conventional driving circuit on the LCD device by using the ACF.

Referring to FIGS. 12 and 13, a driving circuit 70 and an LCD panel are electrically connected to each other through an ACF 90. In the connection through the ACF 90, the ACF 90 is adhered to the TFT array substrate 81, which may be a glass substrate, and the driving circuit 70 is bonded to the ACF 90. Thereafter, in a final bonding process, a plurality of conductive particles 35 flows in the ACF 90 and some of the particles are captured between a bump 75 and a pad 83 on the TFT array substrate 81, thereby electrically connecting the driving circuit 70 to the pad 83 on the TFT array substrate 81. However, only about 10 to 30 percent of the conductive particles 35 are involved in making the electrical connections, and thus much of the conductive particles 35 are wasted. In addition, as the area of the bump 75 is decreased, the number of the conductive particles that can be captured on the bump 75 becomes smaller and this causes an increase the resistance of the electrical connection. Further, as discussed with regard to FIGS. 3 and 4, open circuit and short circuit failures may occur in this conventional arrangement.

Figure 14:
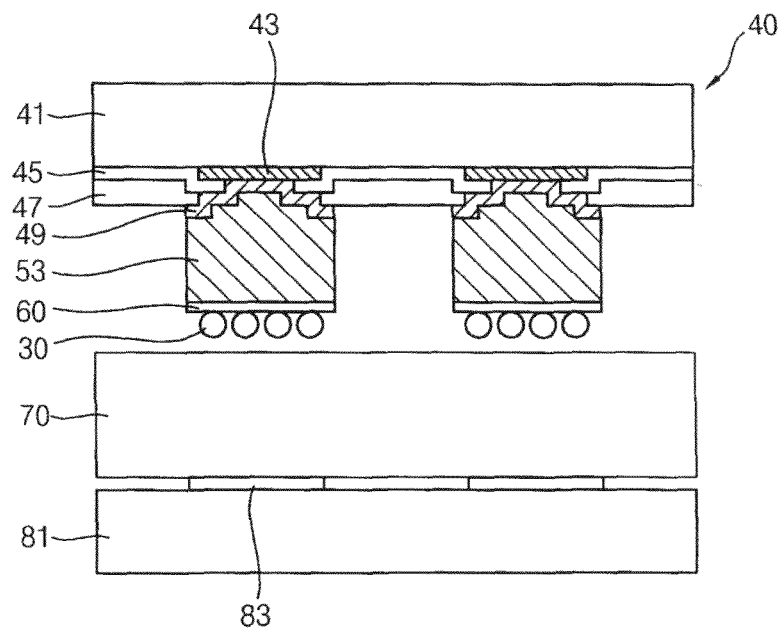
FIG. 14 is a cross-sectional view illustrating a method of mounting a driving circuit according to an exemplary embodiment of the present invention on an LCD device by using a non-conductive film (NCF)
Figure 15:
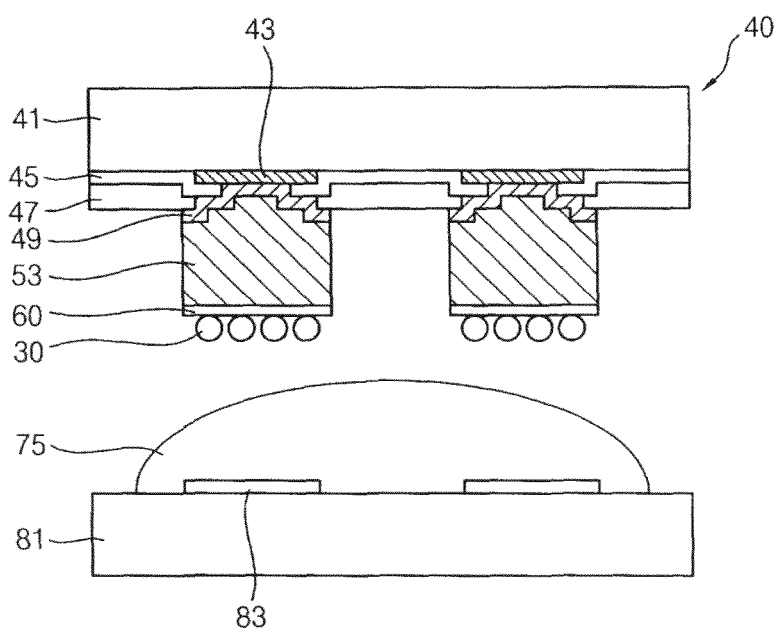
FIG. 15 is a cross-sectional view illustrating a method of mounting a driving circuit according to an exemplary embodiment of the present invention on an LCD device by using a non-conductive paste (NCP)
Figure 16:
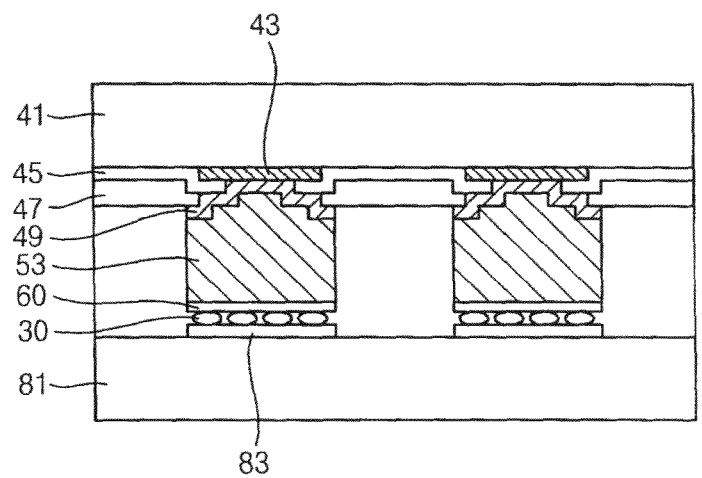
FIG. 16 is a cross-sectional view illustrating a structure in which a driving circuit is attached to an LCD device according to an embodiment of the present invention.

FIG. 14 is a cross-sectional view illustrating a method of mounting a driving circuit according to an exemplary embodiment of the present invention on an LCD device by using a non-conductive film (NCF). FIG. 15 is a cross-sectional view illustrating a method of mounting a driving circuit according to an exemplary embodiment of the present invention on an LCD device by using a non-conductive paste (NCP). FIG. 16 is a cross-sectional view illustrating a structure of the driving circuit according to an exemplary embodiment of the present invention on an LCD device.

Referring to FIGS. 14 and 15, the driving circuit 40 having the conductive particles 30 formed on the bump 53 is mounted on a TFT array substrate 81 of an LCD panel.

The TFT array substrate 81 is cleaned so that foreign substances may not be present on the TFT array substrate 81. Then, an NCF 70 or an NCP 75 is bonded on a pad 83 formed on the TFT array substrate 81. The NCF 70 and the NCP 75 are adhesive and non-conductive. The non-conductive adhesive may include a non-conductive film, a non-conductive paste, an ultra-violet curable adhesive or an epoxy group adhesive. Thereafter, the bump 53 on the driving circuit is bonded on the pad 83 on which the NCF 70 or the NCP 75 is bonded. When final bonding is performed, the conductive particles 30 electrically connect the bump 53 and the pad 83 to each other in response to the application of pressure during the final bonding as shown in FIG. 16.

Although the distance between bumps 53 is irregular, the inner elastic portions 34a and 34b may compensate for the irregularity, thereby maintaining a stable electrical connection.

According to the present invention, a conductive particle is disposed on a bump of a driving circuit for an LCD device to improve electrical contact between an LCD panel and the driving circuit. The conductive particle includes an inner portion comprising an elastic material, the conductive particle including the elastic polymer inner portion may compensate the irregularity between bumps, although the distance between the bumps is irregular. Thus, after the driving circuit is mounted on the LCD panel, a stable electrical connection may be obtained to reduce electrical connection resistance and prevent reliability defects. In addition, the conductive particles are not disposed between the bumps and thus electrical short circuits between bumps are precluded. Also, even when intervals between the bumps and the pads of the LCD panel are various, the bump may be electrically connected to the pad of the LCD panel through the conductive particle by the compression of the conductive particles to prevent an electrical open defect. Further, the bumps may have a fine pitch, so that chip size may be reduced to increase the number of net dies per wafer, thereby reducing manufacturing cost. Thus, the driving circuit may be applied to an LCD display IC (LDI) having a fine pitch.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A driving circuit for a liquid crystal display (LCD) device comprising:
   an integrated circuit (IC) that generates a signal;
   an electrode pad formed on the IC to transmit the signal;
   a bump formed on the electrode pad to receive the signal;
   a conductive particle formed on the bump to electrically connect the bump to an external electronic device; and
   a conductive layer disposed between the bump and the conductive particle,
   wherein the conductive particle includes a first electrically conductive material, the conductive layer includes a second electrically conductive material and the conductive layer electrically connects the bump and the conductive particle.

2. The driving circuit of claim 1, wherein the conductive particle comprises an outer layer including the first electrically conductive material and an inner portion including an elastic polymer material.

3. The driving circuit of claim 2, wherein the first electrically conductive material comprises at least one metal selected from the group consisting of gold (Au) and nickel (Ni).

4. An LCD device comprising:
   a driving circuit comprising:
      an integrated circuit (IC) that generates a signal;
      an electrode pad formed on the IC to transmit the signal;
      a bump formed on the electrode pad to receive the signal;
      a conductive particle formed on the bump; and
      a conductive layer disposed between the bump and the conductive particle, wherein the conductive particle includes a first electrically conductive material, the conductive layer includes a second electrically conductive material and the conductive layer electrically connects the bump and the conductive particle;
   a thin-film transistor (TFT) array substrate comprising a pad electrically connected to the bump of the driving circuit through the conductive particle of the driving circuit;
   a color filter substrate facing the TFT array substrate; and
   a liquid crystal layer disposed between the TFT array substrate and the color filter substrate.

5. The LCD device of claim 4, wherein the driving circuit comprises a plurality of bumps electrically insulated from each other.

6. The LCD device of claim 4, further comprising a non-conductive adhesive configured to adhere the bump of the driving circuit to the TFT array substrate.

7. The LCD device of claim 6, wherein the non-conductive adhesive comprises at least one selected from the group consisting of a non-conductive film, a non-conductive paste, an ultraviolet adhesive and an epoxy group adhesive.

8. The LCD device of claim 4, wherein the conductive particle comprises an outer layer including the first electrically conductive material and an inner portion including an elastic polymer material.

9. The LCD device of claim 8, wherein the first electrically conductive material comprises at least one metal selected from the group consisting of gold (Au) and nickel (Ni).

10. The driving circuit of claim 1, wherein the conductive layer absorbs a stress between the bump and the conductive particle.

11. A driving circuit for use in a liquid crystal display device, the driving circuit comprising:
    an integrated circuit that generates a signal;
    an electrode pad formed on the integrated circuit to transmit the signal;
    a passivation layer having a contact hole exposing the electrode pad;
    a bump formed on the electrode pad to receive the signal;
    a conductive particle disposed on the bump; and
    a conductive layer disposed between the bump and the conductive particle,
    wherein the conductive layer electrically connects the bump and the conductive particle.

12. The driving circuit of claim 11, wherein a portion of the electrode pad is disposed between the passivation layer and the integrated circuit.

13. The driving circuit of claim 11, wherein the bump is disposed between the passivation layer and the conductive particle.

14. The driving circuit of claim 11 further comprising a metal layer, wherein a portion of the metal layer is disposed between the bump and the passivation layer.

15. The driving circuit of claim 11 further comprising an insulating layer, wherein a portion of the insulating layer is disposed between the bump and the integrated circuit.

16. The driving circuit of claim 15, wherein the insulating layer is disposed between the passivation layer and the conductive particle.

17. The driving circuit of claim 15 further comprising a metal layer, wherein a portion of the metal layer is disposed between the bump and the insulating layer.

* * * * *